US007005909B2

(12) United States Patent
Shin

(10) Patent No.: US 7,005,909 B2
(45) Date of Patent: *Feb. 28, 2006

(54) LEVEL SHIFTER AND FLAT PANEL DISPLAY

(75) Inventor: Dong-Yong Shin, Seoul (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/040,412

(22) Filed: Jan. 21, 2005

(65) Prior Publication Data

US 2005/0140421 A1    Jun. 30, 2005

Related U.S. Application Data

(63) Continuation of application No. 10/445,070, filed on May 23, 2003, now Pat. No. 6,891,422.

(30) Foreign Application Priority Data

Aug. 1, 2002  (KR) ............................... 2002-45524

(51) Int. Cl.
*H03L 5/00* (2006.01)
(52) U.S. Cl. ................... 327/333; 327/382; 327/589; 329/63; 329/80
(58) Field of Classification Search ............. 327/333, 327/382, 390, 437, 589; 326/63, 80, 88; 345/90, 98, 100
See application file for complete search history.

(56) References Cited

U.S. PATENT DOCUMENTS

| 3,506,851 | A | 4/1970 | Polkinghorn et al. |
| 3,872,321 | A | 3/1975 | Matsue |
| 3,925,689 | A | 12/1975 | Rubenstein |
| 4,129,794 | A | 12/1978 | Dickson et al. |
| 4,443,720 | A | 4/1984 | Takemae |
| 4,459,498 | A | 7/1984 | Stengl et al. |
| 4,574,203 | A | 3/1986 | Baba |

(Continued)

FOREIGN PATENT DOCUMENTS

DE    23 40 770 A1    2/1975

(Continued)

OTHER PUBLICATIONS

Search Report of Corresponding European Application No. 03 09 0140, dated Jan. 14, 2004.

*Primary Examiner*—Timothy P. Callahan
*Assistant Examiner*—An T. Luu
(74) *Attorney, Agent, or Firm*—Christie, Parker and Hale, LLP

(57) ABSTRACT

In a level shifter, first and second PMOS transistors are connected in series between first and second power sources for supplying first high level and low level voltages, respectively, and a capacitor is formed between a contact point of the first and second transistors and the second transistor's gate. A third PMOS transistor is diode-connected and connected between the first and second transistors' gates. When a second low level voltage is input to the first transistor's gate, a second high level voltage is output to the contact point according to an on resistance ratio of the first and second transistors. When a first high level voltage is input to the first transistor's gate, the second transistor is bootstrapped according to the voltage charged to the capacitor so that a first low level voltage is substantially output to the contact point. Since the level shifter outputs voltages substantially corresponding to voltages which the first and second power sources supply respectively, a range of the output voltage may be extended.

20 Claims, 7 Drawing Sheets

U.S. PATENT DOCUMENTS

| | | |
|---|---|---|
| 4,704,551 A | 11/1987 | Berger |
| 5,138,200 A | 8/1992 | Barsanti et al. |
| 5,694,061 A | 12/1997 | Morosawa et al. |
| 5,701,136 A * | 12/1997 | Huq et al. ............ 345/100 |
| 5,781,171 A | 7/1998 | Kihara |
| 5,796,277 A | 8/1998 | Kim et al. |
| 6,088,014 A | 7/2000 | Furuhashi et al. |
| 6,278,426 B1 * | 8/2001 | Akiyama ............ 345/87 |

FOREIGN PATENT DOCUMENTS

| | | |
|---|---|---|
| DE | 31 00 795 A1 | 8/1982 |
| GB | 1 215 698 | 12/1970 |

* cited by examiner

LEVEL SHIFTER AND FLAT PANEL DISPLAY

CROSS REFERENCE TO RELATED APPLICATIONS

This application is a continuation of U.S. patent application Ser. No. 10/445,070 filed May 23, 2003 now U.S. Pat. No. 6,891,422 which claims priority to and the benefit of Korean Patent Application No. 2002-45524 filed on Aug. 1, 2002 in the Korean Intellectual Property Office, the entire contents in each of the above referenced applications are incorporated herein by reference.

BACKGROUND OF THE INVENTION (a) Field of the Invention

The present invention relates to a level shifter and a flat panel display including the level shifter. More specifically, the present invention relates to a level shifter for decreasing a low-level voltage in a system including PMOS transistors, or a level shifter for increasing a high-level voltage in a system including NMOS transistors.

(b) Description of the Related Art

A level shifter represents a circuit provided between two digital systems, for modifying values of signal voltages when coupling the two digital systems having different signal voltages. The level shifter is used for converting the signal voltage values in a low voltage range into those in a high voltage range.

FIG. 12 shows a circuit diagram of a level shifter according to a prior art.

As shown in FIG. 12, the conventional level shifter includes two PMOS transistors P1 and P2. In this instance, transistor P1 is coupled between high-level power VDD and an output end, and transistor P2 is diode-connected between the output end and low-level power LVSS.

In this conventional level shifter, when low level voltage VSS is applied to gate of transistor P1, high-level output voltage Vout is determined according to the on resistance ratio of transistors P1 and P2. When high-level voltage VDD is applied to gate of transistor P1, low-level output voltage Vout reaches a voltage (LVSS+|Vp|) higher than LVSS by the values of threshold voltage Vp of transistor P2.

In this instance, when decreasing LVSS so as to obtain a desired low-level output voltage, a high-level output voltage is decreased. When the high level output voltage is decreased as described above, a circuit that receives an output from a level shifter may detect the high-level output voltage as a low-level voltage. That is, when attempting to detect a high-level output voltage of the conventional level shifter as a high-level input voltage of another circuit, the low-level output voltage is not decreased to a desired level.

SUMMARY OF THE INVENTION

In accordance with the present invention, a level shifter for performing a level shift process on an input voltage to generate an output voltage over a desired range is provided. The present invention uses bootstrap to output voltages over a desired range.

In one aspect of the present invention, a level shifter receives input voltage signals alternately having a first level voltage and a second level voltage and generates a third level voltage and a fourth level voltage according to the first level voltage and the second level voltage. A first transistor is coupled between a first power having a fifth level voltage and an output end, and has a gate for receiving the input voltage signal. A second transistor is coupled between the output end and a second power source having a sixth level voltage. A capacitance component is formed between the output end and a gate of the second transistor. A switching element applies a voltage corresponding to the first level voltage to the gate of the second transistor in response to the first level voltage and cuts off the input voltage signal and the gate of the second transistor electrically in response to the second level voltage.

Preferably, the switching element is a diode-connected transistor coupled between the gate of the first transistor and the gate of the second transistor and being reverse-biased according to the second level voltage.

It is preferable that the level shifter further includes at least a third transistor coupled in series between the output end and the second transistor, and the third transistor has a gate coupled to a gate of the second transistor.

The capacitance component preferably includes a parasitic component of the second transistor, a separate capacitor or their combination.

In another aspect of the present invention, a level shifter includes a first PMOS transistor and a second PMOS transistor coupled in series between a first power for supplying a first high level voltage and a second power for supplying a first low level voltage. A capacitance component is formed between a contact point of the first PMOS transistor and the second PMOS transistor and a gate of the second PMOS transistor. An electrical path is formed to supply a third low level voltage corresponding to a second low level voltage to the gate of the second PMOS transistor when the second low level voltage is input to a gate of the first PMOS transistor, wherein the second high level voltage is output to the contact point according to the on resistance ratio of the first PMOS transistor and the second PMOS transistor when the second low level voltage is input to the gate of the first PMOS transistor. The second PMOS transistor is bootstrapped according to the voltage charged to the capacitance component when a third high level voltage is input to the gate of the first PMOS transistor, thereby substantially outputting the first low level voltage to the contact point.

In still another aspect of the present invention, a level shifter includes a first NMOS transistor and a second NMOS transistor coupled in series between a first power for supplying a first low level voltage and a second power for supplying a first high level voltage. A capacitance component is formed between a contact point of the first NMOS transistor and the second NMOS transistor and a gate of the second NMOS transistor. An electrical path is formed to apply a third high level voltage corresponding to the second high level voltage to the gate of the second NMOS transistor when the second high level voltage is input to the gate of the first NMOS transistor. A second low level voltage is output to the contact point according to the on resistance ratio of the first NMOS transistor and the second NMOS transistor when the second high level voltage is input to the gate of the first NMOS transistor. The second NMOS transistor is bootstrapped according to the voltage charged to the capacitance component when a third low level voltage is input to the gate of the first NMOS transistor so that the first high level voltage is substantially output to the contact point.

In still a further aspect of the present invention a flat panel display apparatus, which can include the various above-described level shifter embodiments as part thereof, is provided. The flat panel display apparatus includes a display area having a plurality of scan lines and a plurality of data lines. A shift register applies scan signals to the scan lines according to timing signals. A data driver applies data signals to the data lines according to the timing signals. A timing controller generates the timing signals and applies the timing signals to the data driver and to the shift register though a level shifter. A level shifter is coupled between, at least one of, the timing controller and the shift register, the shift register and the scan lines, and between the timing controller and the data driver. The level shifter receives input voltage signals alternately having a first level voltage and a second level voltage, and generates a third level voltage and a fourth level voltage respectively according to the first level voltage and the second level voltage.

DETAILED DESCRIPTION

Figure 1:
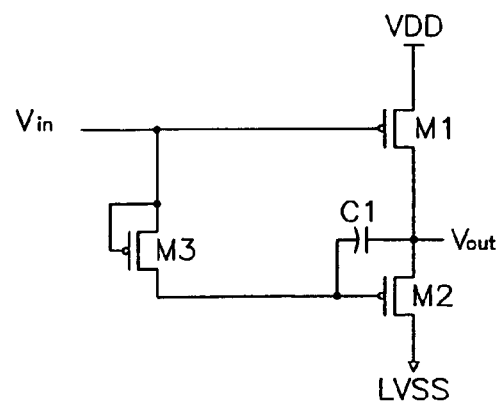
FIG. 1 shows a circuit diagram of a level shifter according to a first embodiment of the present invention.

In the following detailed description various embodiments of the invention have been shown and described. In the description set forth herein similar parts are denoted by the same reference numerals. When a part is connected to another part, the part is not only directly connected to another part but also electrically connected to another part with another device intervening in them.

Referring to drawings, a level shifter and a flat panel display according to the various embodiments of the present invention will now be described in detail.

Figure 2:
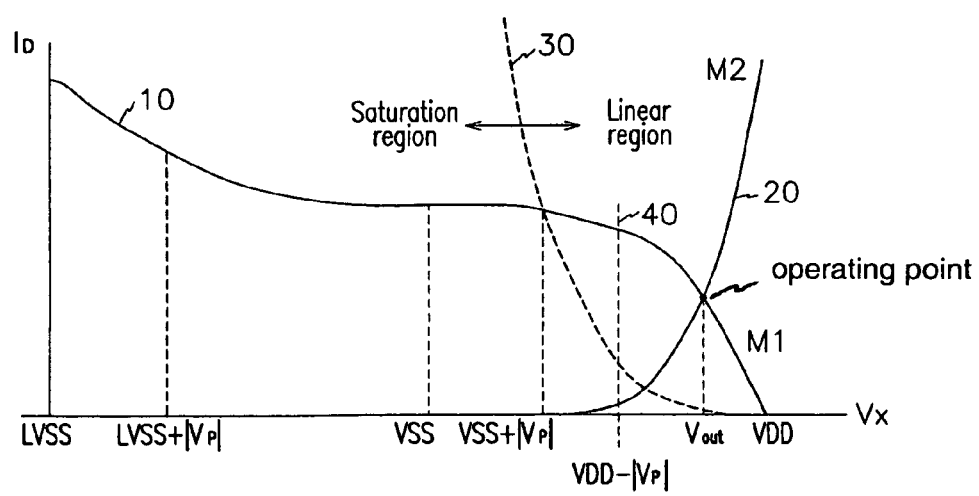
FIG. 2 shows a diagram depicting the operating point of the level shifter according to the first embodiment of the present invention.

With reference to FIGS. 1 and 2, a level shifter according to a first embodiment of the present invention will be described. FIG. 1 shows a circuit diagram of a level shifter according to the first embodiment of the present invention. FIG. 2 shows a diagram depicting the operating point of the level shifter according to the first embodiment of the present invention.

As shown in FIG. 1, the level shifter includes PMOS transistors M1, M2, and M3. A source of transistor M1 is connected to a power source for supplying voltage VDD. A drain of transistor M2 is connected to a power source for supplying voltage LVSS. Voltages VDD and LVSS respectively represent a high level voltage and a low level voltage. The drain of transistor M1 and the source of transistor M2 are connected, and the voltage at their meeting point becomes output voltage Vout of the level shifter. A gate and a drain of transistor M3 is connected (transistor M3 is diode-connected) to function as a diode. Input voltage Vin is input to the gate of transistor M1 and the drain of transistor M3. The gate and the source of transistor M2 are respectively connected to the source of transistor M3 and the drain of transistor M1. Capacitor C1 is connected between them. Capacitor C1 includes a parasitic capacitor of transistor M2, a separate capacitor, and their combination.

Referring to FIG. 2, the operation of the level shifter of FIG. 1 will now be described. It is assumed that input voltage Vin alternately has low-level voltages VSS and high-level voltages VDD, voltage VSS is higher than LVSS, and summation (VSS+|Vp|) of VSS and magnitude |Vp| of threshold voltage Vp of transistor M3 is substantially a voltage for turning on transistor M2.

First, when input voltage Vin is low-level voltage VSS, transistor M1 is turned on, and transistor M2 is also turned on because of voltage (VSS+|Vp|) applied to the gate node of transistor M2. In this instance, output voltage Vout is determined according to the on resistance ratio of transistors M1 and M2. However, since source voltage VDD of transistor M1 is greater than the source voltage of transistor M2, and gate voltage VSS of transistor M1 is less than gate voltage (VSS+|Vp|) of transistor M2, source-gate voltage $V_{SG1}$ of transistor M1 becomes greater than the source-gate voltage $V_{SG2}$ of transistor M2. Therefore, since the on resistance of transistor M1 is less than the on resistance of transistor M2, output voltage Vout becomes close to high-level power voltage VDD. While high-level output voltage Vout is provided, the gate node of transistor M2 is discharged to approach input voltage VSS, and the current flowing to transistor M3 becomes close to 0 A. Accordingly, the on resistance of transistor M2 is decreased, and output voltage Vout is also decreased. When the voltage at the gate node of transistor M2 becomes input voltage VSS, the operating point is determined as shown in FIG. 2.

When setting the drain voltage of transistor M1 and the source voltage of transistor M2 to be Vx, corresponding drain currents $I_D$ of transistors M1 and M2 respectively become as shown by curves 10 and 20. In this instance, from among the two portions of curve 10 divided by curve 30, the left portion is set to be a saturation region, and the right portion is defined to be a linear region. Since transistor M2 is provided in the saturation region, current $I_D$ of curve 20 is expressed in Equation 1.

(Equation 1):

$$I_D = \frac{1}{2}\mu C_{ox} \frac{W}{L}(V_x - VSS - |V_p|)^2$$

wherein $\mu$ represents hole mobility, $C_{ox}$ shows oxide capacitance, W and L respectively indicate a channel width and a channel length of transistor M2, and $V_x$ represents a source node voltage of transistor M2.

Since the cross point of curves 10 and 20 is the operating point, the operating point is provided on the right of straight line 40 according to low-level value VSS of the input voltage without relation to low-level voltage LVSS connected to the level shifter, and output voltage Vout is detected to be high-level in another circuit. Also, high-level output voltage Vout may be appropriately controlled by controlling a ratio (W/L) of channel width W and channel length L of transistor M2 to control the gradient of curve 20.

Next, when the input signal becomes high level VDD, transistor M1 is turned off, and transistor M2 is turned on because of the voltage charged to capacitor C1 so that output voltage Vout is decreased to low-level power voltage LVSS. Since input voltage Vin is high level VDD and the gate voltage of transistor M2 is close to VSS, diode-connected transistor M3 is reverse-biased, almost no current flows to diode-connected transistor M3, and the gate node of transistor M2 becomes floated. Therefore, the voltage at capacitor C1 is maintained, and as the output voltage is lowered, the gate voltage of transistor M2 is bootstrapped, output voltage Vout is reduced to low-level power voltage LVSS thereby becoming constant irrespective of threshold voltage Vp.

In the first embodiment of the present invention, diode-connected transistor M3 is used between the input end and the gate of transistor M2. Instead of using transistor M3, another element for applying a voltage corresponding to the low level to the gate of transistor M2 when a low-level voltage is input and making the gate of transistor M2 be floated when a high-level voltage is input may be used.

According to the first embodiment of the present invention, when input voltage Vin is low-level voltage VSS, a voltage close to high-level voltage VDD may be output, and when input voltage Vin is high-level voltage VDD, desired voltage LVSS less than low-level voltage VSS of the input voltage may be output. In addition, to make output voltage Vout be close to VDD, it is required to reduce ratio (W/L) of channel width W and channel length L of transistor M2, which will be described in detail with reference to FIG. 3.

Figure 3:
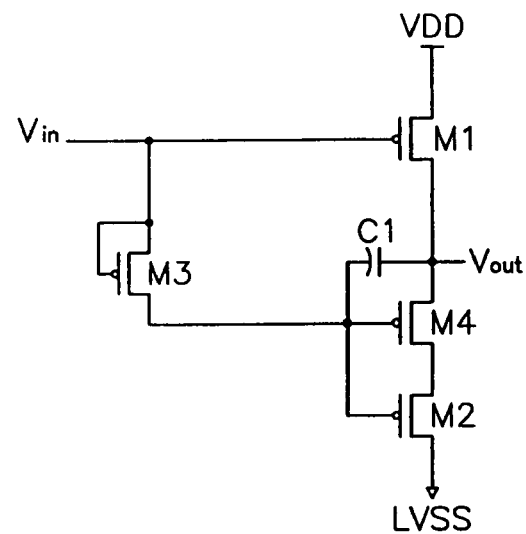
FIGS. 3, 4, and 6 show circuit diagrams of a level shifter according to second to fourth embodiments of the present invention, respectively.

FIG. 3 shows a level shifter according to a second embodiment of the present invention. As shown, the level shifter according to the second embodiment has a configuration of the level shifter according to the first embodiment of the present invention with the exception of transistor M4. In detail, transistor M4 includes a source, a gate, and a drain, respectively connected to the output end, the gate of transistor M2, and the source of transistor M2. In this instance, capacitor C1 is connected between the gate and the source of transistor M4, and a contact point of transistors M1 and M4 becomes the output end.

Assuming that the channel width and the channel length according to the features of transistors M2 and M4 are respectively set to be W and L and to be identical under the above-noted configuration, two transistors M2 and M4 are connected in series, and accordingly, the ratio of the channel width and the channel length equivalently becomes W/2 L. Then, since the ratio of the channel width and the channel length is reduced, from the current $I_D$ expressed in Equation 1, the operation point is formed at a higher voltage in the graph of FIG. 2 and the static current is also reduced. Therefore, high-level output voltage Vout higher than the high-level output voltage of the first embodiment of the present invention, that is, closer to VDD is obtained. Further, since the source voltage of transistor M2 is less than the source voltage of transistor M4, the summation of the on resistance of transistors M2 and M4 of FIG. 3 is a little greater than the on resistance of the transistor M2 having the channel length of 2 L of the first embodiment, it is advantageous to obtain high-level output voltage Vout.

In the second embodiment of the present invention, single transistor M4 is added between the output end and transistor M2, and without being restricted to this, a transistor that commonly has a gate with transistor M4 may be added between the output end and the source of transistor M4.

In the above, in the first and the second embodiments of the present invention, a level shifter for outputting a high-level voltage when a low-level voltage is applied, and for outputting a low-level voltage when a high-level voltage is applied has been described.

Below, a level shifter for having non-inverted outputs will be described by adding an inverter to the first and the second embodiments referring to FIGS. 4 to 6.

Figure 4:
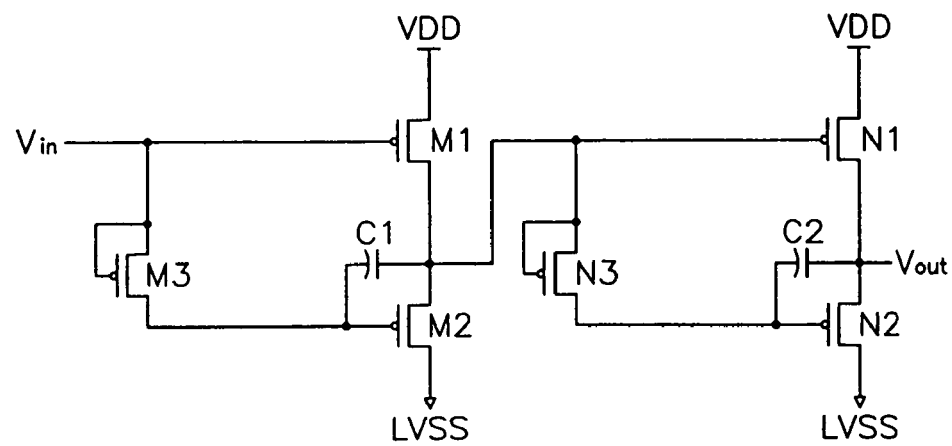
Figure 5:
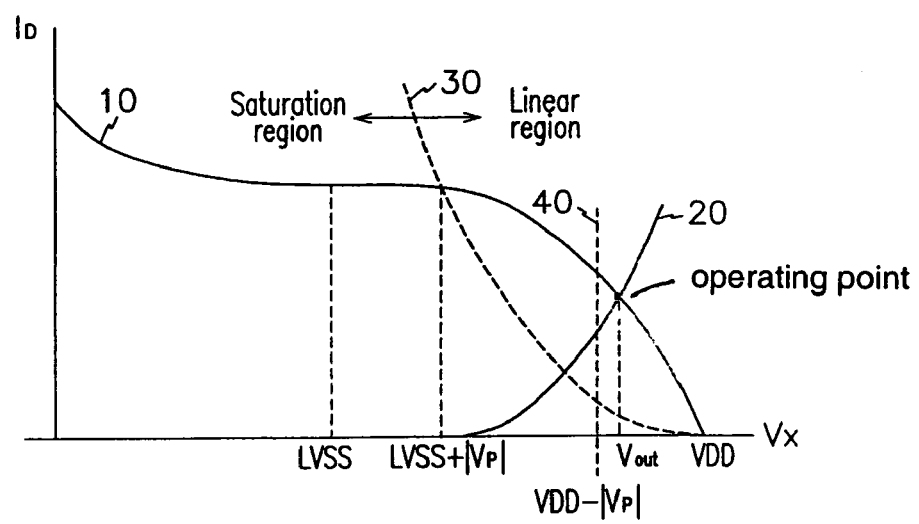
FIG. 5 shows a diagram depicting the operating point of the level shifter according to the third embodiment of the present invention.
Figure 6:
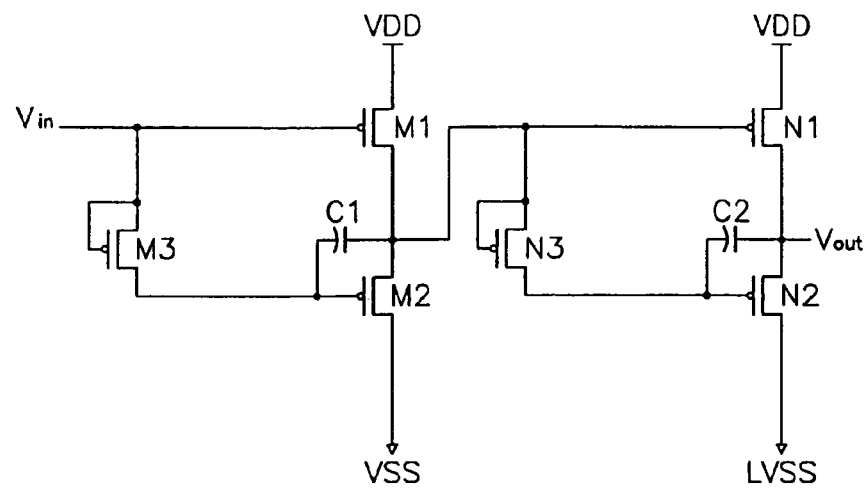

FIGS. 4 and 6 respectively show a level shifter according to a third and a fourth embodiment of the present invention. FIG. 5 shows the operating point of the level shifter according to the third embodiment of the present invention.

As shown in FIG. 4, the level shifter according to the third embodiment of the present invention has a configuration for connecting two level shifters according to the first embodiment of the present invention. In detail, when input voltage Vin is low-level voltage VSS, the voltage at the contact point of transistors M1 and M2 becomes high-level, and the voltage at the contact point of transistors N1 and N2, that is, an output voltage of the level shifter becomes low-level voltage LVSS because of this high-level voltage. When input voltage Vin is high-level voltage VDD, the voltage at the contact point of transistors M1 and M2 becomes low-level, and the output voltage of the level shifter becomes a high-level voltage because of this low-level voltage. Therefore, the level shifter according to the third embodiment of the present invention has non-inverted outputs.

However, in the third embodiment of the present invention, the voltage of LVSS is input as a low-level input voltage to transistors N1 and N3. The gate node voltage of transistor N2 is then a summation of input voltage LVSS and an absolute value |Vp| of the threshold voltage of transistor N3, and hence, current $I_D$ flowing to transistor N2 is expressed in Equation 2.

(Equation 2):

$$I_D = \frac{1}{2}\mu C_{ox}\frac{W}{L}(V_x - LVSS - |V_p|)^2$$

The operating point, that is a cross point of curve 10 of FIG. 5 and current curve 20 of Equation 2, becomes close to LVSS, and output voltage Vout becomes lower than the high-level voltage VDD. In this case, since a circuit for receiving an output from the level shifter may detect the high-level output voltage as a low-level one, LVSS may not be reduced to a desired value when attempting to enable another circuit to detect the high-level output voltage as high-level. Therefore, it is desirable to set the low-level power voltage connected to transistor M2 of the first circuit higher than LVSS. Below, an embodiment of coupling two circuit of FIG. 1 and setting the low-level power voltage of the first circuit as VSS will be described referring to FIG. 6.

As shown in FIG. 6, the level shifter according to the fourth embodiment is identical with the level shifter according to the third embodiment except that the low-level power voltage of the first circuit is the voltage VSS higher than LVSS. Therefore, since the low-level output voltage of the first circuit, that is, the low-level voltage input to transistors N1 and N3 of the first circuit becomes VSS, high-level output voltage Vout of the level shifter is determined irrespective of LVSS as described in the first embodiment. Accordingly, low-level output voltage LVSS of the level shifter may be decreased to a desired value.

In the third and the fourth embodiments, two level shifters according to the first embodiment are connected, and further, two level shifters according to the second embodiment or the level shifters according to the first and the second embodiments may be connected.

In the above, in the first to fourth embodiments, the level shifters using PMOS transistors have been described. In the PMOS level shifter, it is required to supply a low-level voltage to charge a capacitor, and to supply a high-level voltage to pull down the output voltage. That is, it is desirable to supply a low-level voltage to the level shifter to reset the level shifter at the start of driving so that the operation of the level shifter may start correctly. The PMOS level shifter generally reduces the low-level voltage to a more lowered value to shift a voltage level, and an NMOS transistor is used to shift the high-level voltage. Below, level shifters using NMOS transistors will be described with reference to FIGS. 7 to 10.

Figure 7:
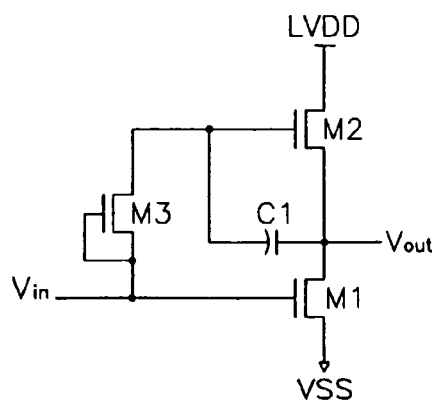
FIGS. 7 to 10 show circuit diagrams of a level shifter according to other embodiments of the present invention, respectively.

FIGS. 7 to 10 respectively show a level shifter according to further embodiments of the present invention. Referring to FIG. 7, the level shifter has a configuration matched with that of the level shifter of FIG. 1 differing as to the NMOS transistors and power sources LVDD and VSS. In detail, the level shifter of FIG. 7 includes NMOS transistors M1, M2, and M3, and transistors M1 and M2 are connected in series between the power source for supplying low-level voltage VSS and the power source for supplying high-level voltage LVDD. High-level voltage LVDD is a voltage greater than input voltage's high level voltage VDD.

When high-level voltage VDD is input to the level shifter, transistor M1 is turned on, a voltage close to low-level power voltage VSS is output according to the on resistance ratio of transistors M1 and M2. Capacitor C1 is charged with a voltage corresponding to a voltage difference between output voltage Vout and the gate node of transistor M2. Next, when low-level voltage VSS is input to the level shifter, the gate node of transistor M2 is floated, and transistor M2 functions as a bootstrap circuit because of the voltage charged to capacitor C1. Therefore, output voltage Vout substantially increases to high-level power voltage LVDD because of the bootstrap circuit.

Figure 8:
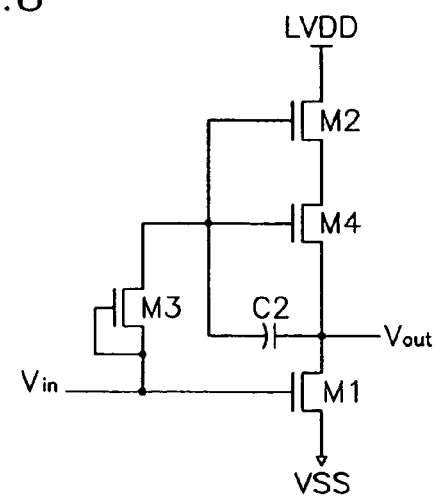

FIG. 8 shows a level shifter to which transistor M4 commonly having a gate with transistor M2 is added. As described in the second embodiment, ratio W/L of channel width W and channel length L is reduced by adding transistor M4, thereby making output voltage Vout more close to VSS.

Figure 9:
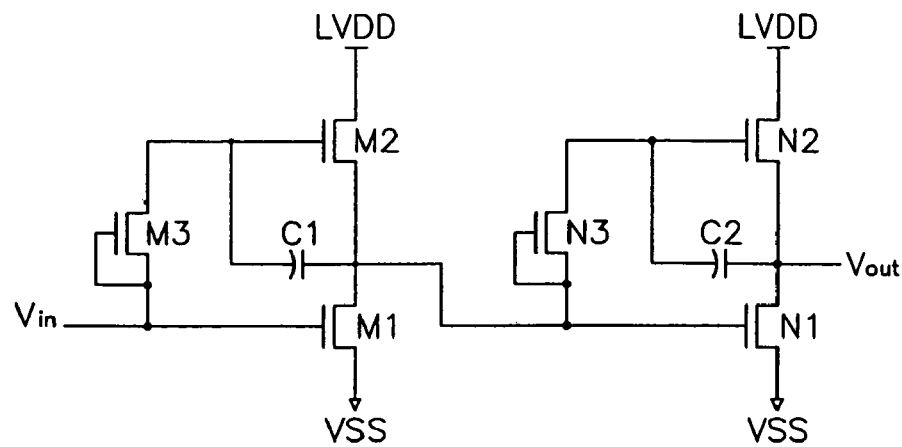
Figure 10:
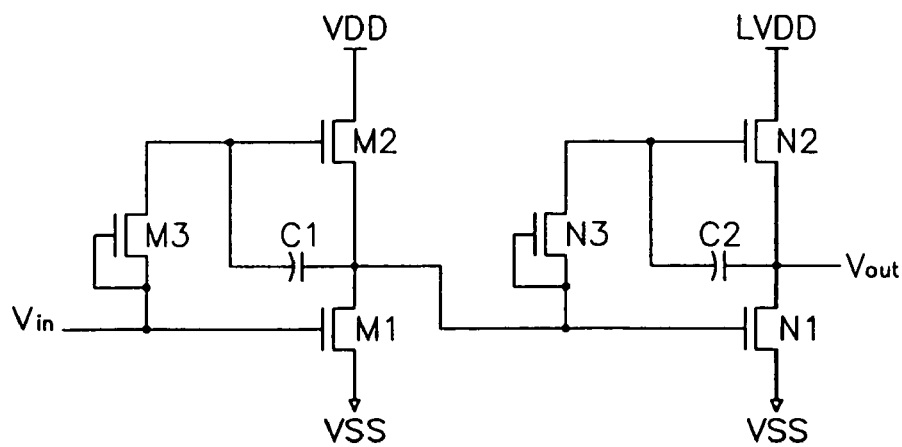

Referring to FIGS. 9 and 10, as described in the third and the fourth embodiments, two level shifters are connected so as not to invert the output voltage. In this instance, as shown in FIG. 9, when LVDD is used for the high-level power of the first circuit, another circuit may detect the low-level output voltage of the level shifter as a high-level voltage as described in the third embodiment of the present invention. When attempting to allow the circuit to read the low-level output voltage as low-level, LVDD may not be increased to a desired value. Hence, as shown in FIG. 10, it is desirable to use the voltage VDD that is less than LVDD for the high-level power voltage of the first circuit.

The two level shifters of FIG. 7 are connected in the embodiments of FIGS. 9 and 10, and further, the two level shifters of FIG. 8 or the level shifters of FIGS. 7 and 8 may be connected. In the above, the level shifters according to various embodiments have been described, and they may be applied to a flat panel display using ICs of different voltage levels to convert the voltage levels between the ICs and the flat panel display. Below, a flat panel display using a level shifter according to another embodiment of the present invention will be described with reference to FIG. 11.

Figure 11:
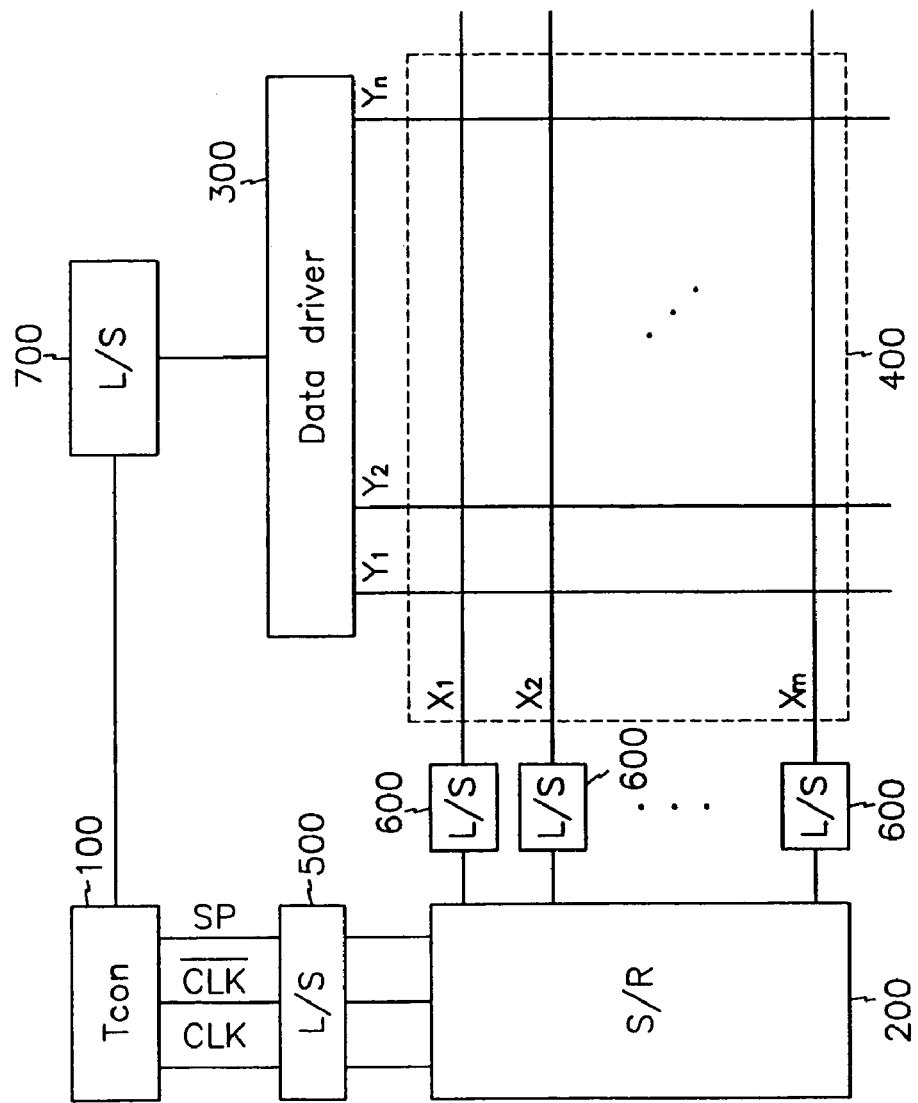
FIG. 11 shows a block diagram of a flat panel display using a level shifter according to embodiments of the present invention.
Figure 12:
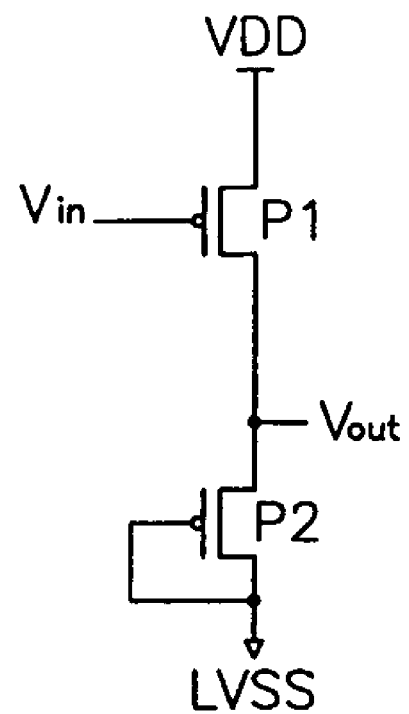
FIG. 12 shows a circuit diagram of a level shifter according to a prior art.

FIG. 11 shows a flat panel display using a level shifter according to an embodiment of the present invention. The flat panel display includes timing controller Tcon 100, shift register S/R 200, data driver 300, and display area 400. Timing controller 100 generates timing signals CLK, /CLK, and SP for driving shift register 200 and data driver 300. Shift register 200 receives timing signals from timing controller 100 to sequentially apply scan signals to scan lines $X_1$ to $X_m$ formed on display area 400. Data driver 300 applies data signals to data lines $Y_1$ to $Y_n$ of display area 400 according to the timing signals.

For example, assuming that the voltage ranges used by timing controller 100 and shift register 200 are different, level shifter L/S 500 according to the embodiment is between timing controller 100 and shift register 200 so that the output voltage range of timing controller 100 may be modified to a voltage range used by shift register 200.

In a like manner, assuming that the voltage ranges used by shift register 200 and display area 400 are different, level shifter L/S 600 is formed between shift register 200 and scan lines $X_1$ to $X_m$ of display area 400 so that the output voltage range of shift register 200 may be modified to a voltage range used by display area 400. In this configuration a buffer (not illustrated) is formed between level shifter 500 and display area 400. In addition, assuming that the voltage ranges used by timing controller 100 and data driver 300 are different, level shifter L/S 700 according to the embodiment is formed between timing controller 100 and data driver 300 so that the output voltage range of timing controller 100 may be modified to a voltage range used by data driver 300.

FIG. 11 shows a case for respectively using a level shifter between timing controller 100 and shift register 200, between shift register 200 and display area 400, and between timing controller 100 and data driver 300, and without being restricted to this, the above description may be applied to cases for modifying voltage ranges of the flat panel display.

According to the present invention, in the PMOS level shifter, the high-level output voltage may be increased to a desired voltage by increasing the resistance between the output end and the low-level power source, and the low-level output voltage may be decreased to a desired value by using a bootstrap. In a like manner, the NMOS level shifter may control the low-level and high-level outputs to desired voltages. As the resistance increases, the static current flowing to the transistor is reduced, thereby reducing power consumption.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A level shifter f or receiving input voltage signals alternately having a first level voltage and a second level voltage, and generating a third level voltage and a fourth level voltage respectively according to the first level voltage and the second level voltage, comprising:

an input end for receiving the input voltage signals;
an output end for outputting the third level voltage and the fourth level voltage;
a first transistor coupled between a first power source having a fifth level voltage and the output end, and having a gate for receiving the input voltage signals from the input end;
a second transistor coupled between the output end and a second power source having a sixth level voltage;
a capacitance component formed between the output end and a gate of the second transistor; and
a third transistor having a first electrode coupled between the gate of the first transistor and the input end, a second electrode coupled to the gate of the second transistor, and a gate coupled to the first electrode of the third transistor, wherein the third transistor is a switching element for applying a voltage corresponding to the first level voltage to the gate of the second transistor in response to the first level voltage, and cutting off the input voltage signals and the gate of the second transistor electrically in response to the second level voltage, wherein the output end is coupled between the first transistor and the second transistor to output the third level voltage and the fourth level voltage.

2. The level shifter of claim 1, further comprising a second level shifter having a fourth transistor coupled to a third power source having a seventh level voltage, the second level shifter being coupled to the first level shifter via the output end of the first level shifter.

3. The level shifter of claim 1, wherein the third level voltage is determined according to the on resistance ratio of the first transistor and the second transistor.

4. The level shifter of claim 3, wherein the on resistance of the second transistor is determined according to the first level voltage.

5. The level shifter of claim 1, wherein the fourth level voltage is substantially the sixth level voltage.

6. The level shifter of claim 1, wherein the fifth level voltage is substantially the second level voltage, and the sixth level voltage is further from the second level voltage than the first level voltage.

7. The level shifter of claim 1, wherein the first transistor and the second transistor are PMOS transistors, and the first level voltage and the second level voltage are respectively a low level voltage and a high level voltage.

8. The level shifter of claim 7, wherein the output end is coupled between a drain of the first transistor and a source of the second transistor.

9. The level shifter of claim 1, wherein the first transistor and the second transistor are NMOS transistors, and the first level voltage and the second level voltage are respectively a high level voltage and a low level voltage.

10. The level shifter of claim 9, wherein the output end is coupled between a source of the second transistor and the a drain of the first transistor.

11. The level shifter of claim 1, wherein at least portion of the capacitance component is formed according to a parasitic component of the second transistor.

12. The level shifter of claim 1, wherein the capacitance component is formed by a capacitor coupled between the output end and the gate of the second transistor.

13. The level shifter of claim 1, further comprising a fourth transistor coupled between the second transistor and the second power source, and having a gate coupled to the gate of the second transistor.

14. A flat panel display apparatus comprising:
a display area having a plurality of scan lines and a plurality of data lines;
a shift register applying scan signals to the scan lines according to timing signals;
a data driver applying data signals to the data lines according to the timing signals;
a timing controller generating the timing signals and applying the timing signals to the data driver and to the shift register;
a first level shifter coupled between, at least one of, the timing controller and the shift register, the shift register and the scan lines, and between the timing controller and the data driver, and receiving input voltage signals alternately having a first level voltage and a second level voltage, and generating a third level voltage and a fourth level voltage respectively according to the first level voltage and the second level voltage, the first level shifter including:
an output end for outputting the third level voltage and the fourth level voltage;
a first transistor coupled between a first power source having a fifth level voltage and the output end, and having a gate for receiving the input voltage signals;
a second transistor coupled between the output end and a second power source having a sixth level voltage;
a capacitance component formed between the output end and a gate of the second transistor;
a switching element for applying a voltage corresponding to the first level voltage to the gate of the second transistor in response to the first level voltage, and cutting off the input voltage signals and the gate of the second transistor electrically in response to the second level voltage, wherein the output end is coupled between the first transistor and the second transistor to output the third level voltage and the fourth level voltage; and
a second level shifter having a third transistor coupled to a third power source having a seventh level voltage, the second level shifter being coupled to the first level shifter via the output end of the first level shifter.

15. A level shifter comprising:
an output end for outputting a first low level voltage and a second high level voltage;
a first PMOS transistor and a second PMOS transistor coupled in series between a first power source for supplying a first high level voltage and a second power source for supplying the first low level voltage;
a capacitance component formed between the output end and a gate of the second PMOS transistor; and
a third PMOS transistor formed in an electrical path to supply a third low level voltage corresponding to a second low level voltage to the gate of the second PMOS transistor when the second low level voltage is input to a gate of the third PMOS transistor,
wherein the second high level voltage is output to the output end according to the on resistance ratio of the first PMOS transistor and the second PMOS transistor when the second low level voltage is input to the gate of the first PMOS transistor, and the second PMOS transistor is bootstrapped according to the voltage charged to the capacitance component when a third high level voltage is input to the gate of the first PMOS transistor, thereby outputting the first low level voltage to the output end, and
wherein the output end is coupled between a drain of the first PMOS transistor and a source of the second PMOS transistor to output the first low level voltage and the second high level voltage.

16. The level shifter of claim 15, wherein the first low level voltage is less than the second low level voltage.

17. The level shifter of claim 15, wherein the level shifter is included within a flat panel display apparatus having:
a display area having a plurality of scan lines and a plurality of data lines;
a shift register applying scan signals to the scan lines according to timing signals;
a data driver applying data signals to the data lines according to the timing signals; and a timing controller generating the timing signals and applying the timing signals to the data driver and to the shift register though the level shifter, and wherein the level shifter is couplable between, at least one of, the timing controller and the shift register, the shift register and the scan lines, and between the timing controller and the data driver.

18. A level shifter comprising:

an output end for outputting a first high level voltage and a second low level voltage;

a first NMOS transistor and a second NMOS transistor coupled in series between a first power source for supplying a first low level voltage and a second power source for supplying the first high level voltage;

a capacitance component formed between the output end and a gate of the second NMOS transistor; and a third NMOS transistor formed in an electrical path to supply a third high level voltage corresponding to a second high level voltage to the gate of the second NMOS transistor when the second high level voltage is input to the gate of the third NMOS transistor, wherein a second low level voltage is output to the output end according to the on resistance ratio of the first NMOS transistor and the second NMOS transistor when the second high level voltage is input to the gate of the first NMOS transistor, and the second NMOS transistor is bootstrapped according to the voltage charged to the capacitance component when a third low level voltage is input to the gate of the first NMOS transistor so that the first high level voltage is output to the output end, and wherein the output end is coupled between a drain of the first NMOS transistor and the a source of the second NMOS transistor to output the first high level voltage and the second low level voltage.

19. The level shifter of claim 18, wherein the first high level voltage is greater than the second high level voltage.

20. The level shifter of claim 18, wherein the level shifter is included within a flat panel display apparatus having:

a display area having a plurality of scan lines and a plurality of data lines;

a shift register applying scan signals to the scan lines according to timing signals;

a data driver applying data signals to the data lines according to the timing signals; and a timing controller generating the timing signals and applying the timing signals to the data driver and to the shift register though the level shifter, and wherein the level shifter is couplable between, at least one of, the timing controller and the shift register, the shift register and the scan lines, and between the timing controller and the data driver.

* * * * *